(12) United States Patent
Jung et al.

(10) Patent No.: US 8,912,028 B2
(45) Date of Patent: Dec. 16, 2014

(54) SEMICONDUCTOR LIGHT EMITTING DEVICE AND METHOD FOR MANUFACTURING THE SAME

(75) Inventors: Taeil Jung, Goyang-si (KR); YoungChae Kim, Bucheon-si (KR); SunMan Kim, Goyang-si (KR); Yeji Han, Paju-si (KR); Chunghoon Park, Hanam-si (KR); Byeong-Kyun Choi, Paju-si (KR); Se-Eun Kang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/330,315

(22) Filed: Dec. 19, 2011

(65) Prior Publication Data
US 2013/0043503 A1 Feb. 21, 2013

(30) Foreign Application Priority Data
Aug. 17, 2011 (KR) .................. 10-2011-0081548

(51) Int. Cl.
*H01L 33/42* (2010.01)
*H01L 33/20* (2010.01)

(52) U.S. Cl.
CPC ............ *H01L 33/42* (2013.01); *H01L 33/20* (2013.01)
USPC .......... 438/39; 257/98; 257/99; 257/E33.063; 257/E33.064; 257/E33.065

(58) Field of Classification Search
USPC ............... 257/88, 98, 99, E33.063–E33.065; 438/39
See application file for complete search history.

(56) References Cited

U.S. PATENT DOCUMENTS

| | | | |
|---|---|---|---|
| 7,608,859 B2 * | 10/2009 | Konno et al. | 257/79 |
| 7,700,960 B2 * | 4/2010 | Kim et al. | 257/88 |
| 7,714,337 B2 * | 5/2010 | Kim et al. | 257/94 |
| 7,927,901 B2 * | 4/2011 | Fang et al. | 438/46 |
| 2005/0139825 A1 * | 6/2005 | Song et al. | 257/44 |
| 2005/0279990 A1 * | 12/2005 | Liu et al. | 257/13 |
| 2010/0003511 A1 * | 1/2010 | So | 428/336 |

FOREIGN PATENT DOCUMENTS

| | | |
|---|---|---|
| CN | 1992359 A | 7/2007 |
| CN | 100438092 C | 11/2008 |

OTHER PUBLICATIONS

Liu et al. "ZnS/Ag/ZnS nano-multilayer films for transparent electrodes in flat display application." Applied Surface Science vol. 183, pp. 103-110, Sep. 4, 2001.*
"ZnS/Ag/ZnS nano-multilayer films for transparent electrodes in flat display application." Applied Surface Science Vo. 183, pp. 103-110, Sep. 4, 2001.*
Liu et al. (ZnS/Ag/ZnS nano-multilayer films for transparent electrodes in flat display application. Applied Surface Science Vo. 183, pp. 103-110, Sep. 4, 2001).*
Liu et al. (ZnS/Ag/ZnS nano-multilayer films for transparent electrodes in flat display application. Applied Surface Science vol. 183, pp. 103-110, Sep. 4, 2001).*

* cited by examiner

*Primary Examiner* — Matthew W Such
*Assistant Examiner* — Stephen Bradley
(74) *Attorney, Agent, or Firm* — Birch, Stewart, Kolasch and Birch, LLP

(57) ABSTRACT

A semiconductor light emitting device, which includes a light transmissive electrode layer formed using a conductive thin film and an insulating thin film to substitute for a transparent electrode layer, comprises a substrate; a first semiconductor layer formed on the substrate; an active layer formed on the first semiconductor layer; a second semiconductor layer formed on the active layer; a light transmissive electrode layer formed on the second semiconductor layer, the light transmissive electrode layer having a structure in which at least one conductive thin film and at least one insulating thin film are deposited; and a first electrode formed on the light transmissive electrode layer, wherein the light transmissve electrode layer includes at least one contact portion for contacting the at least one conductive thin film with the first electrode.

3 Claims, 13 Drawing Sheets heating

SEMICONDUCTOR LIGHT EMITTING DEVICE AND METHOD FOR MANUFACTURING THE SAME

CROSS REFERENCE TO RELATED APPLICATIONS

This application claims the benefit of the Korean Patent Application No. 10-2011-0081548 filed on Aug. 17, 2011, which is hereby incorporated by reference for all purposes as if fully set forth herein.

BACKGROUND OF THE INVENTION

1. Field of the Invention

The present invention relates to a semiconductor device, and more particularly, to a semiconductor light emitting device.

2. Discussion of the Related Art

Generally, a semiconductor light emitting device has a light emitting region containing ultraviolet, blue, and green regions. In particular, a GaN-based semiconductor light emitting device may be used for an optical device of a blue/green light emitting diode (LED), and an electronic device with high speed switching and high output power performance such as a metal semiconductor field effect transistor (MESFET), a hetero junction field effect transistor (HEMT), etc.

FIG. 1 is a perspective view illustrating a structure of such a general semiconductor light emitting device.

As shown in FIG. 1, the semiconductor light emitting device 100 includes a substrate 110, a buffer layer 120, an undoped semiconductor layer 130, an N type semiconductor layer 140, an active layer 150, a P type semiconductor layer 160, a transparent electrode layer 170, a P type electrode 180 formed on the transparent electrode layer 170, and an N type electrode 190 formed on the N type semiconductor layer 140 exposed by partially etching the active layer 150 and the P type semiconductor layer 160. Although the active layer 150 and the P type semiconductor layer 160 are partially etched in FIG. 1, a part (upper portion) of the N type semiconductor layer may additionally be etched.

In the aforementioned semiconductor light emitting device 100, the transparent electrode layer 170 is generally formed using indium tin oxide (ITO) to desirably inject a current into the light emitting device 100 without current crowding when the light emitting device 100 is driven.

However, problems occur in that the ITO is expensive and contains indium, which is a rare metal and thus may be exhausted later.

Also, if the transparent electrode layer 170 is formed using the ITO, since light transmittance of the ITO is more than 90%, light may re-enter the light emitting device due to scattering with a phosphor or other material included in the light emitting device package, whereby the light may be lost. For this reason, a problem occurs in that light efficiency may be deteriorated in the semiconductor light emitting device package.

SUMMARY OF THE INVENTION

Accordingly, the present invention is directed to a semiconductor light emitting device and a method for manufacturing that same that substantially obviates one or more problems due to limitations and disadvantages of the related art.

An advantage of the present invention is to provide a semiconductor light emitting device and a method for manufacturing that same, in which the semiconductor light emitting device includes a light transmissive electrode layer formed using a conductive thin film and an insulating thin film to substitute for a transparent electrode layer.

Another advantage of the present invention is to provide a semiconductor light emitting device and a method for manufacturing that same, in which a contact area between a metal electrode and a conductive thin film constituting a light transmissive electrode layer can be increased to reduce contact resistance between the light transmissive electrode layer and the metal electrode and improve current injection efficiency.

Other advantage of the present invention is to provide a semiconductor light emitting device and a method for manufacturing that same, in which characteristic variation of a conductive thin film constituting a light transmissive electrode layer can be minimized.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a semiconductor light emitting device according to one aspect of the present invention comprises a substrate; a first semiconductor layer formed on the substrate; an active layer formed on the first semiconductor layer; a second semiconductor layer formed on the active layer; a light transmissive electrode layer formed on the second semiconductor layer, the light transmissive electrode layer having a structure in which at least one conductive thin film and at least one insulating thin film are deposited; and a first electrode formed on the light transmissive electrode layer, wherein the light transmissve electrode layer includes at least one contact portion for contacting the at least one conductive thin film with the first electrode.

In another aspect of the present invention, a method for manufacturing a semiconductor light emitting device comprises the steps of forming a first semiconductor layer on a substrate; forming an active layer on the first semiconductor layer; forming a second semiconductor layer on the active layer; partially etching the active layer and the second semiconductor layer until the first semiconductor layer is exposed; heating the substrate on which the first semiconductor layer, the active layer and the second semiconductor layer are formed; and forming a light transmissive electrode layer on the second semiconductor layer, the light transmissive electrode layer including at least one conductive thin film and at least one insulating thin film.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, a semiconductor light emitting device and a method for manufacturing the same according to the embodiments of the present invention will be described with reference to the accompanying drawings.

In the description of the embodiments according to the present invention, the disclosure that a structure is formed "on" or "below" another structure should be interpreted to include the disclosure that a third structure is interposed between the structures as well as the disclosure that the structures are in contact with each other. However, if the terminology "directly on" or "directly below" is used, it is to be restricted that the structures are in contact with each other.

Figure 1:
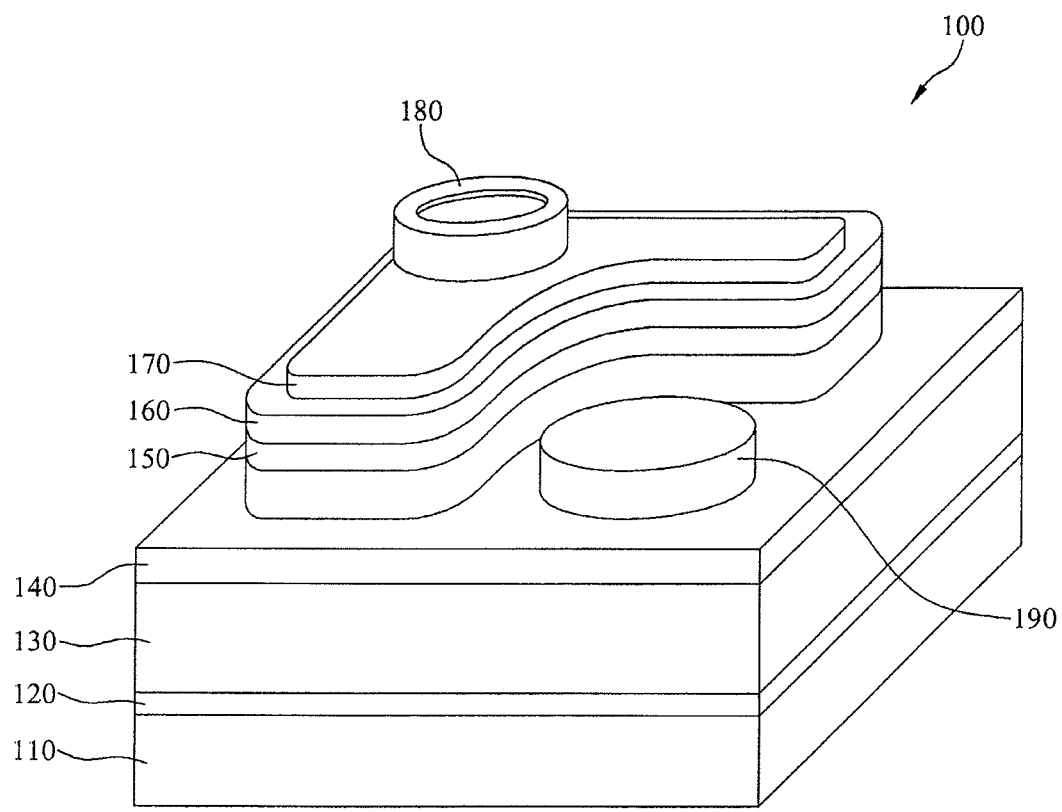
FIG. 1 is a perspective view illustrating a structure of a semiconductor light emitting device according to the related art.
Figure 2:
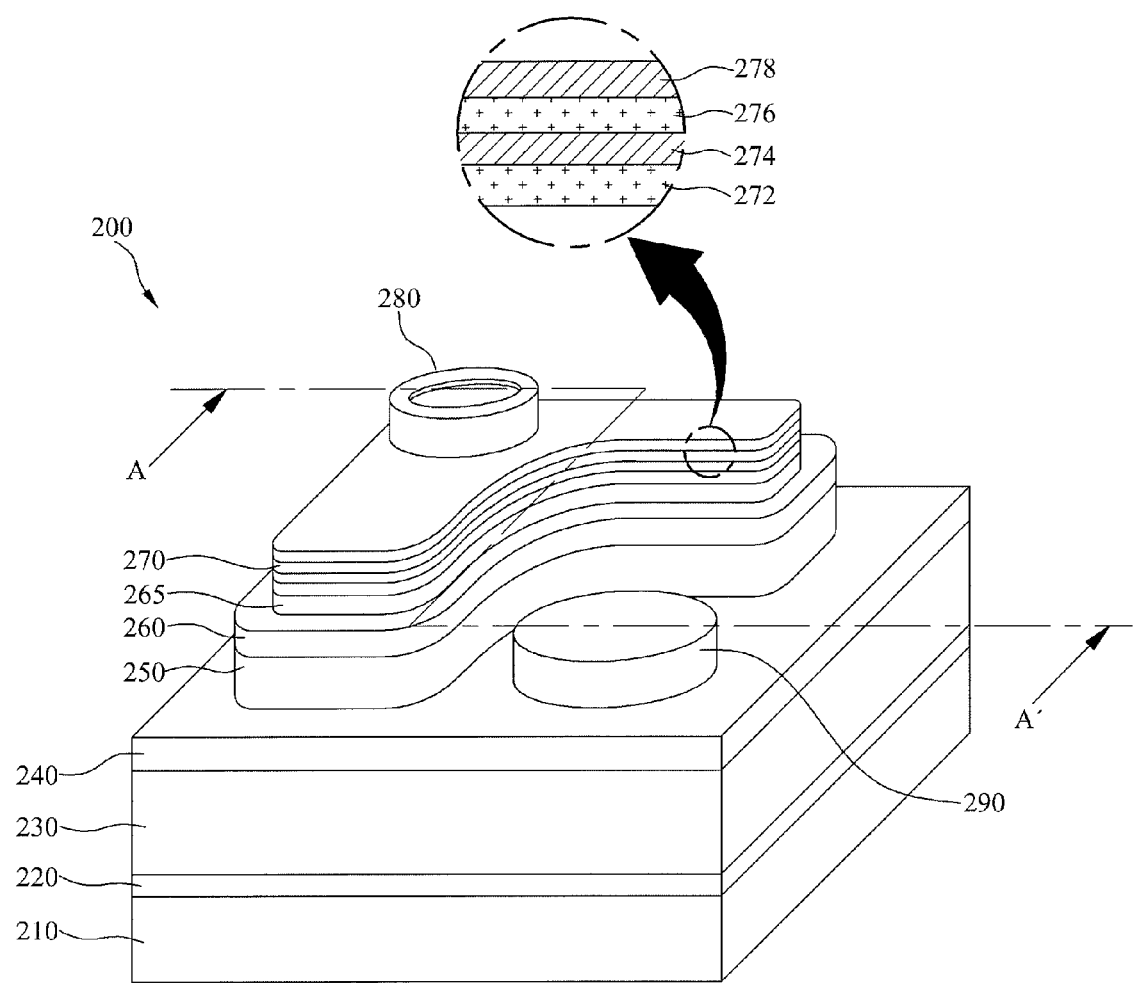
FIG. 2 is a perspective view illustrating a structure of a semiconductor light emitting device according to one embodiment of the present invention.

FIG. 2 is a perspective view illustrating a structure of a semiconductor light emitting device according to one embodiment of the present invention. As shown in FIG. 2, the semiconductor light emitting device 200 according to one embodiment of the present invention includes a substrate 210, an N type semiconductor layer 240, an active layer 250, a P type semiconductor layer 260, a light transmissive electrode layer 270, a P type electrode 280, and an N type electrode 290.

The substrate 210 may be formed using a material such as $Al_2O_3$, SiC, ZnO, Si, or GaAs.

In one embodiment, if the semiconductor layer formed on the substrate 210 is formed of a GaN based semiconductor material, a sapphire substrate may be used as the substrate 210 considering lattice matching.

Referring to FIG. 2, the semiconductor light emitting device 200 may include at least one buffer layer 220 and an undoped semiconductor layer 230.

The buffer layer 220 is formed between the substrate 210 and the N type semiconductor layer 240 to reduce the difference in lattice constants between the substrate 210 and the N type semiconductor layer 240, and may generally be formed using low temperature GaN or AlN.

The undoped semiconductor layer 230 is formed on the buffer layer 220, and may be formed using various GaN based growth methods, such as a metal organic chemical vapor deposition (MOCVD) method, a molecular beam epitaxy (MBE) method, and a hydride vapor phase epitaxy (HVPE) method.

The N type semiconductor layer 240 is formed on the substrate 210 or the undoped semiconductor layer 230, and may be formed of a GaN based semiconductor material. Representative examples of the GaN based semiconductor material include GaN, AlGaN, InGaN, and AlInGaN. At this time, Si may be used as an impurity material used for doping of the N type semiconductor layer 240.

The N type semiconductor layer 240 is formed using the aforementioned semiconductor material through a deposition process such as metal organic chemical vapor deposition (MOCVD), molecular beam epitaxy (MBE), or hydride vapor phase epitaxy (HVPE).

The active layer 250 is to emit light, and is formed by a quantum well grown by depositing a quantum well layer having a narrow bandgap and a barrier layer having a relatively wide bandgap. At this time, multiple quantum wells may be formed by depositing multiple quantum well layers and multiple barrier layers. A quantum well of InGaN/GaN is used in a blue light emitting diode, and quantum well of GaN/AlGaN, InAlGaN/InAlGaN, or InGaN/AlGaN are used in an ultraviolet light emitting diode.

At this time, in respect of efficiency improvement of the active layer 250, light wavelength may be controlled by changing a composition ratio of In or Al of the quantum well, or the depth of the quantum well in the active layer 250, the number of active layers 250, and the thickness of the active layer 250 may be changed, whereby internal quantum efficiency of the semiconductor light emitting device 200 may be improved.

The active layer 250 may be formed on the N type semiconductor layer 240 by a deposition process such as metal organic chemical vapor deposition (MOCVD), molecular beam epitaxy (MBE), or hydride vapor phase epitaxy (HVPE), in the same manner as the aforementioned N type semiconductor layer 240.

The P type semiconductor layer 260 is formed on the active layer 250. According to one embodiment of the present invention, the P type semiconductor layer 260 may be formed of a GaN based semiconductor material. Representative examples of the GaN based semiconductor material include GaN, AlGaN, InGaN, and AlInGaN, as described above, and Mg may be used as an impurity material used for doping of the P type semiconductor layer 260.

The P type semiconductor layer 260 is formed by growing the aforementioned semiconductor material on the active layer 250 through a deposition process such as metal organic chemical vapor deposition (MOCVD), molecular beam epitaxy (MBE), or hydride vapor phase epitaxy (HVPE).

The light transmissive electrode layer 270 is formed on the P type semiconductor layer 260, and substitutes for the existing transparent electrode layer formed of ITO. The light transmissive electrode layer 270 is preferably formed of a transmissive material suitable for lowering contact resistance with the P type semiconductor layer 260 having a relatively high energy bandgap and excellent for upwardly emitting light generated by the active layer 250.

To this end, the light transmissive electrode layer 270 according to the present invention is formed in a structure in which at least one conductive thin film and at least one insulating thin film are deposited.

In one embodiment, the light transmissive electrode layer 270 may be formed in a structure in which a first conductive thin film 272, a first insulating thin film 274, a second conductive thin film 276, and a second insulating thin film 278 are deposited sequentially as shown in FIG. 2.

In another embodiment, the light transmissive electrode layer 270 may include a first conductive thin film 272 and a first insulating thin film 274, or may include a first conductive thin film 272, a first insulating thin film 274, and a second conductive thin film 276.

In still another embodiment, the light transmissive electrode layer 270 may be formed in a structure in which a first insulating thin film 274, a first conductive thin film 272, a second insulating thin film 278, and a second conductive thin film 276 are deposited sequentially. Also, the light transmissive electrode layer 270 may include a first insulating thin film 274 and a first conductive thin film 272, or may include a first insulating thin film 274, a first conductive thin film 272, and a second insulating thin film 278.

In further still another embodiment, the light transmissive electrode layer 270 may be formed in a structure in which three or more conductive thin films and three or more insulating thin films are alternately deposited sequentially.

In addition to the aforementioned structures, the light transmissive electrode layer 270 may include various types of combinations of at least one conductive thin film and at least one insulating thin film.

In the aforementioned embodiments, the light transmissive electrode layer 270 is directly formed on the P type semiconductor layer 260. In the modified embodiment, a buffer layer 265 for improving contact resistance between the P type semiconductor layer 260 and the first conductive thin film 272 of the light transmissive electrode layer 270 or improving surface adhesion and uniform growth of the first conductive thin film 272 may be formed on the P type semiconductor layer 260 as shown in FIG. 2, and the light transmissive electrode layer 270 may be formed on the buffer layer 265. The buffer layer 265 may protect the light transmissive electrode layer 270 from thermal attack that may occur during a later process.

Hereinafter, for convenience of description, it is assumed that the light transmissive electrode layer 270 is formed in the structure as shown in FIG. 2.

First of all, the first conductive thin film 272 is formed on the P type semiconductor layer 260. In one embodiment, the first conductive thin film 272 may be formed at a thickness of 5 nm to 35 nm using Ag.

Next, the first insulating thin film 274 is formed on the first conductive thin film 272. In one embodiment, the first insulating thin film 274 may be formed at a thickness of 10 nm to 70 nm using ZnS.

Next, the second conductive thin film 276 is formed on the first insulating thin film 274. In one embodiment, the second conductive thin film 276 may be formed at a thickness of 1 nm to 35 nm using the same material as that of the first conductive thin film 272, for example, Ag.

Next, the second insulating thin film 278 is formed on the second conductive thin film 278. In one embodiment, the second insulating thin film 278 may be formed at a thickness of 10 nm to 70 nm using the same material as that of the second insulating thin film 274, for example, ZnS.

Figure 3:
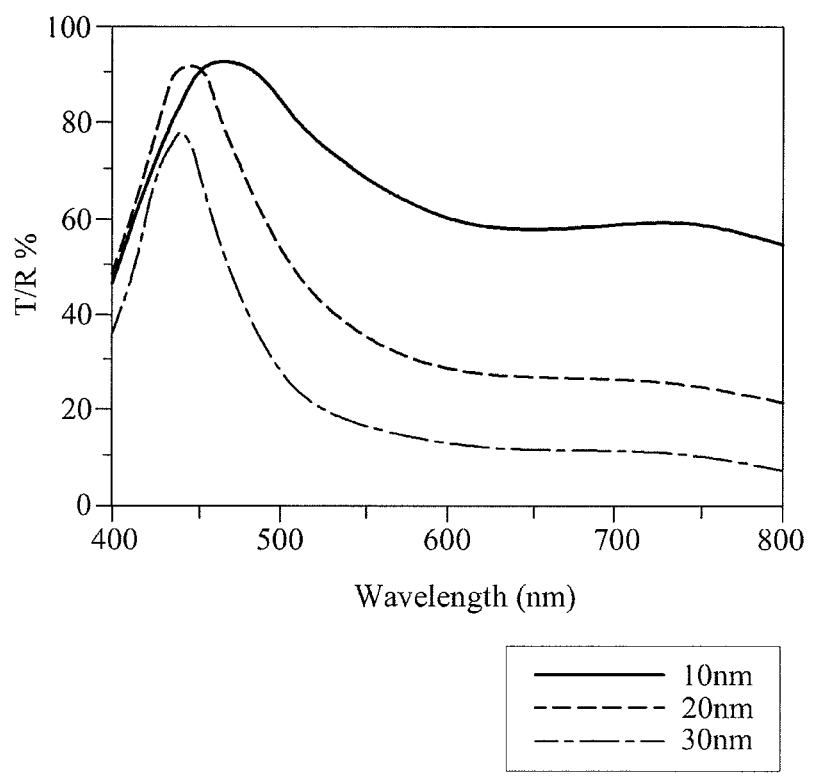
FIG. 3 is a graph illustrating variation of transmittance based on thickness change of a first conductive thin film.

As shown in FIG. 3, it is assumed that the thickness of the first insulating thin film 274 is set to 50 nm, the thickness of the second conductive thin film 276 is set to 10 nm, the thickness of the second insulating thin film 278 is set to 50 nm. and transmittance spectrum is measured by changing the thickness X of the first conductive thin film 272 to 10 nm, 20 nm, and 30 nm. It is noted that the transmittance is reduced when the first conductive thin film 272 becomes thicker.

Figure 4:
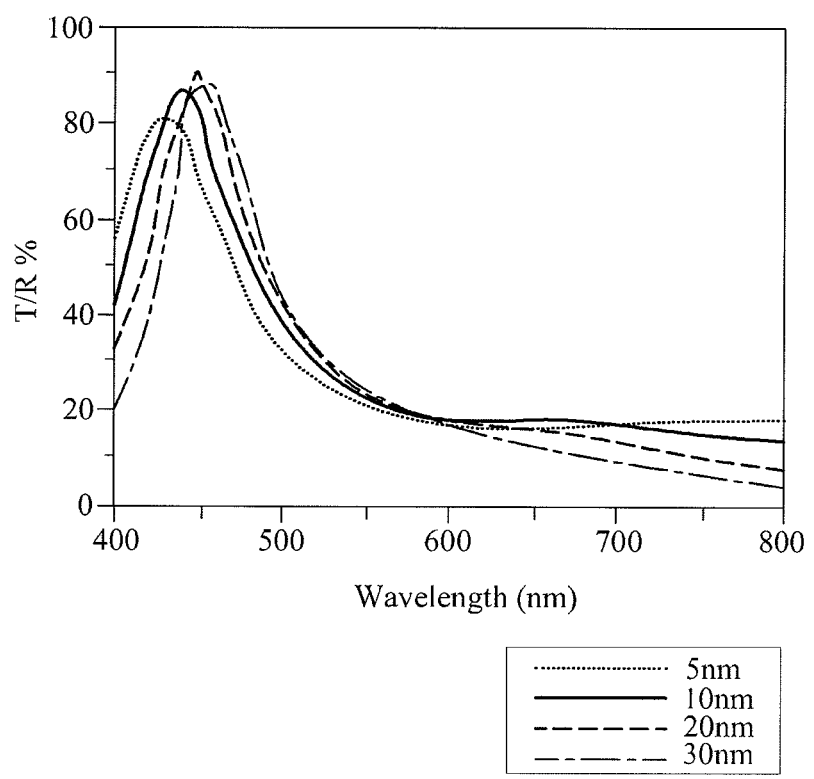
FIG. 4 is a graph illustrating variation of transmittance based on thickness change of first and second insulating thin films.

Also, as shown in FIG. 4, it is assumed that the thickness of the first conductive thin film 272 is set to 25 nm, the thickness of the first insulating thin film 274 is set to 50 nm, and the thickness of the second insulating thin film 278 is set to 50 nm, and transmittance spectrum is measured by changing the thickness X of the second conductive thin film 276 to 10 nm, 20 nm, and 30 nm. It is noted that a peak wavelength of light is moved to a long wavelength band when the thickness of the second conductive thin film 276 becomes thicker.

Figure 5:
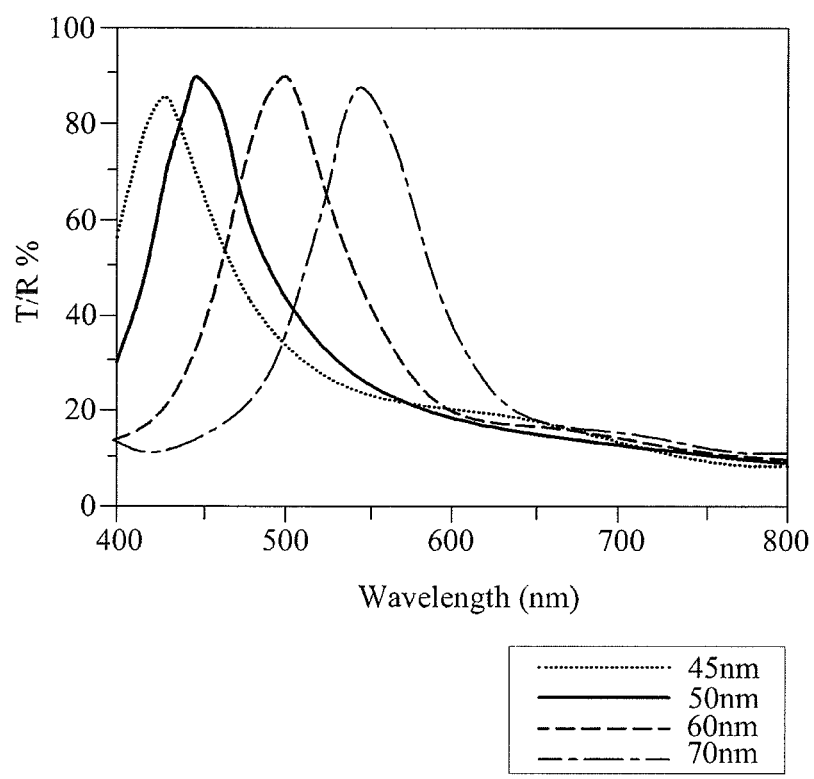
FIG. 5 is a graph illustrating variation of transmittance based on thickness change of a second conductive thin film.

Also, as shown in FIG. 5, it is assumed that the thickness of the first conductive thin film 272 is set to 25 nm, the thickness of the second conductive thin film 276 is set to 15 nm, and transmittance spectrum is measured by changing the thickness X of the first and second insulating thin films 274 and 278 to 45 nm, 50 nm, 60 nm and 70 nm. It is noted that a peak wavelength of light is moved to a long wavelength band when the thicknesses of the first and second insulating thin films 274 and 278 become thicker.

As described above, according to the present invention, the light transmissive electrode layer 270 includes at least one conductive thin film and at least one insulating thin film, whereby a maximum peak of light generated by the active layer 250 may be changed to a predetermined band (for example, 450 nm approximately). Also, light emitted from the semiconductor light emitting device 200 is refracted by a phosphor material or other material layer included in the semiconductor light emitting device package to reflect the light re-entering the semiconductor light emitting device 200, whereby light efficiency may be improved.

Figure 6:
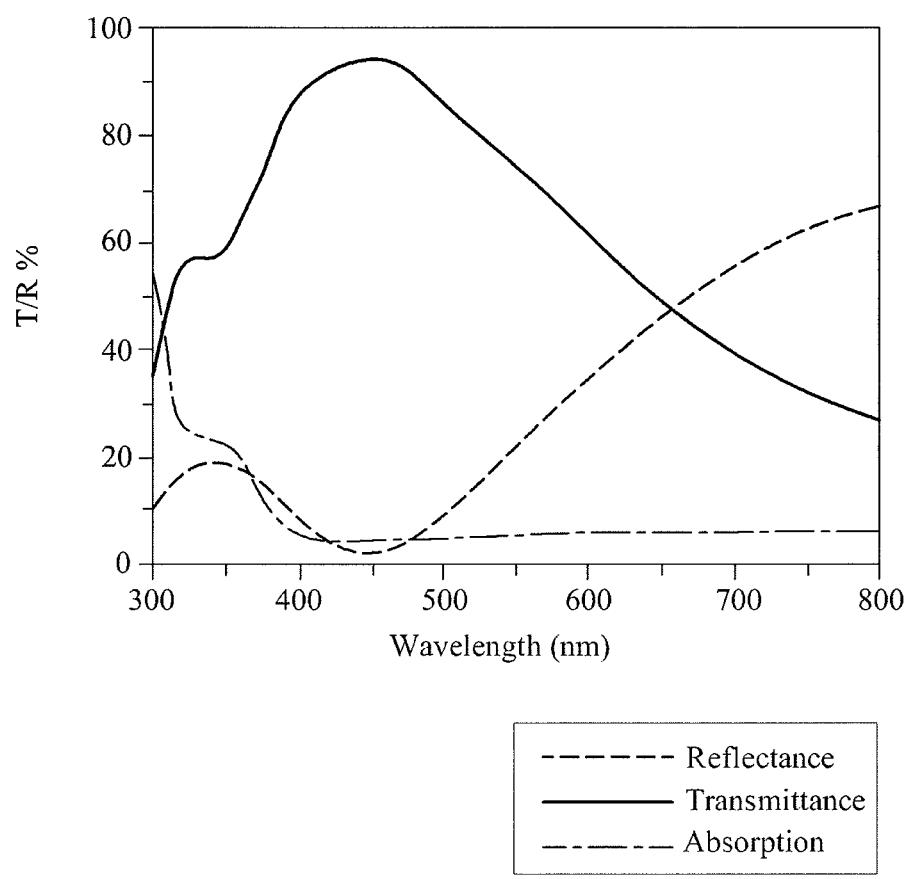
FIG. 6 is a graph illustrating a result of optical simulation of a semiconductor light emitting device shown in FIG. 2.

In other words, as shown in FIG. 6, the light transmissive electrode layer 270 that includes at least one conductive thin film and at least one insulating thin film transmits the light of the predetermined band (for example, 450 nm approximately) as much as 90% or more, and reflects light except the light of the predetermined band from the re-entering light refracted or reflected by the phosphor material or other material layer, whereby light efficiency is improved.

Referring to FIG. 2 again, the P type electrode 280 is formed on the light transmissive electrode layer 270. The P type electrode 280 may be formed of Au or an alloy containing Au by either a deposition method such as an electron beam evaporation method, or a process such as sputtering.

In this case, the P type electrode 280 includes a P type pad and at least one P type finger electrode (not shown) connected to the P type pad to prevent current crowding of the semiconductor light emitting device 200 from occurring. Hereinafter, for convenience of description, the P type pad the P type finger electrode may be referred to as the P type electrode 280.

The N type electrode 290 may be formed of a single layer or a plurality of layers made of a material selected from a group of Ti, Cr, Al and Au on the N type semiconductor layer 240 which is mesa etched. The N type electrode 290 may be formed on the N type semiconductor layer 240 by a deposition method such as an electron beam evaporation method or a process such as sputtering.

In this case, the N type electrode 290 includes an N type pad and at least one N type finger electrode (not shown) connected to the N type pad to prevent current crowding of the semiconductor light emitting device 200 from occurring.

Hereinafter, for convenience of description, the N type pad the N type finger electrode may be referred to as the N type electrode 290.

Meanwhile, one or more contact portions may be formed in the light transmissive electrode layer 270 according to the present invention to improve light efficiency by preventing current crowding from occurring.

Figure 7:
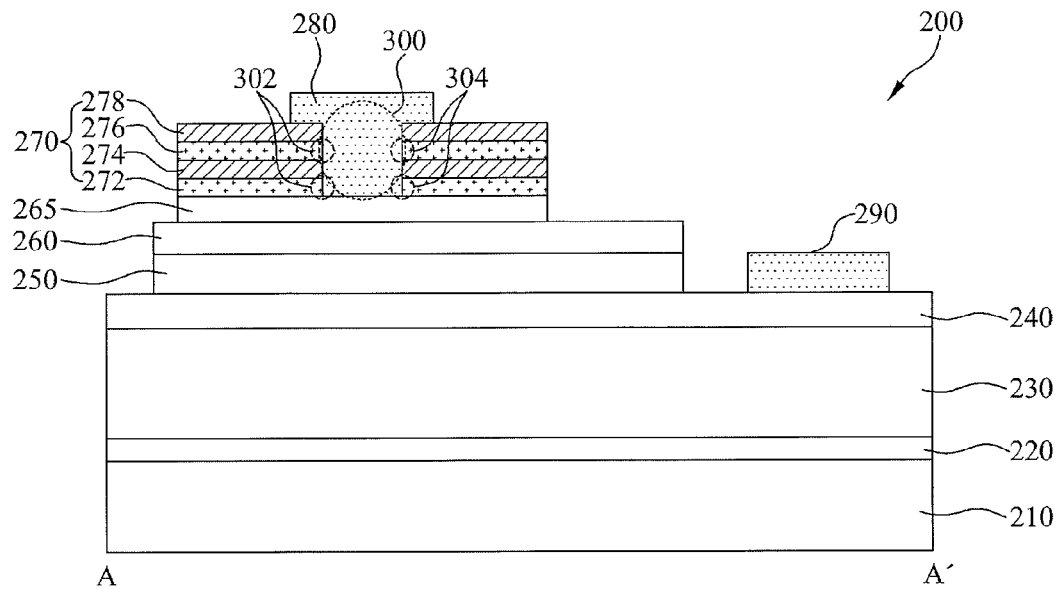
FIG. 7 is a cross-sectional view illustrating a contact portion according to the first embodiment of the present invention.

At this time, a contact portion 300 according to the first embodiment, as shown in FIG. 7, may be formed by partially etching the first conductive thin film 272, the first insulating thin film 274, the second conductive thin film 276, and the second insulating thin film 278 until the second semiconductor layer 260 is exposed.

According to this embodiment, the P type electrode 280 may be formed on a region that covers one or more contact portions 300 on the light transmissive electrode layer 270 as well as the inside of the one or more contact portions 300.

As a result, the P type electrode 280 is in contact with sidewalls 302 and 304 of the first and second conductive thin films 272 and 276 constituting the light transmissive electrode layer 270, whereby contact resistance and current injection efficiency may be improved, and current crowding may be prevented from occurring. In this way, electric characteristics of the semiconductor light emitting device 200 may be improved.

Figure 8:
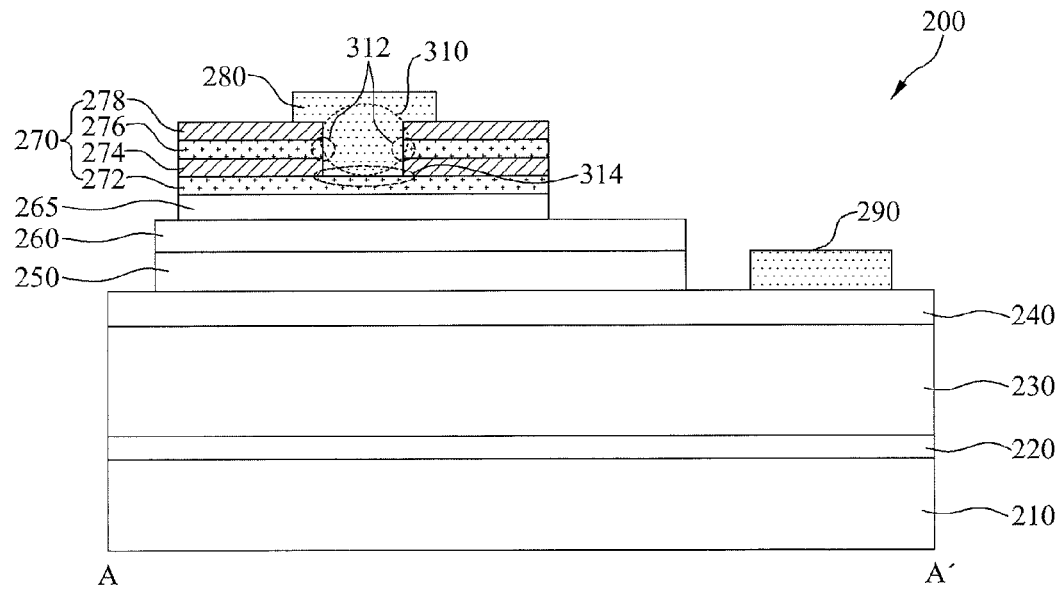
FIG. 8 is a cross-sectional view illustrating a contact portion according to the second embodiment of the present invention.

A contact portion 310 according to the second embodiment, as shown in FIG. 8, may be formed by partially etching the first insulating thin film 274, the second conductive thin film 276, and the second insulating thin film 278 until the first conductive thin film 272 is exposed.

According to this embodiment, the P type electrode 280 may be formed on a region that covers one or more contact portions 310 on the light transmissive electrode layer 270 as well as the inside of the one or more contact portions 310.

As a result, since the P type electrode 280 is in contact with a surface 314 of the first conductive thin film 272 as well as a sidewall 312 of the second conductive thin film 276 constituting the light transmissive electrode layer 270, the contact region may be more extended than that of the first embodiment, whereby current crowding may be more reduced.

Hereinafter, a method for manufacturing a semiconductor light emitting device according to the present invention will be described with reference to FIG. 9 and FIG. 10.

FIGS. 9a to 9f are cross-sectional views illustrating a method for manufacturing a semiconductor light emitting device according to the first embodiment of the present invention.

Figure 9A:
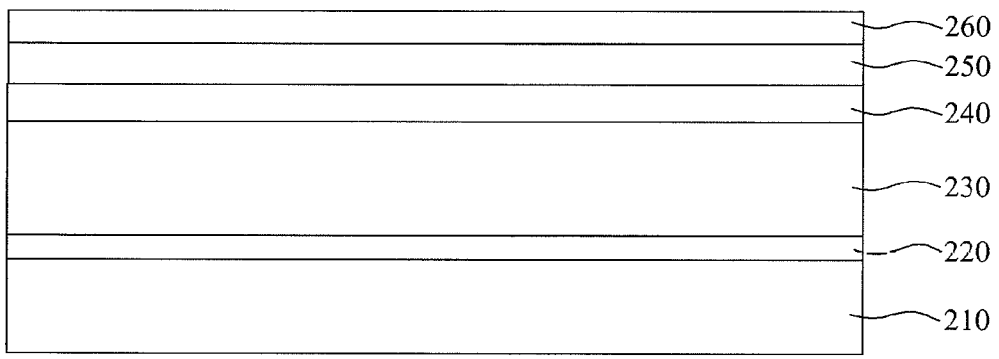
FIGS. 9a to 9f are cross-sectional views illustrating a method for manufacturing a semiconductor light emitting device according to the first embodiment of the present invention.

First of all, referring to FIG. 9a, a buffer layer 220, an undoped semiconductor layer 230, an N type semiconductor layer 240, an active layer 250, and a P type semiconductor layer 260 are sequentially formed on a substrate 210.

In this case, the N type semiconductor layer 240 may be formed by growing a semiconductor material such as GaN, AlGaN, InGaN, and AlInGaN on the substrate 210 through a deposition process such as metal organic chemical vapor deposition (MOCVD), molecular beam epitaxy (MBE), or hydride vapor phase epitaxy (HVPE).

The active layer 250 may be formed through a deposition process such as metal organic chemical vapor deposition (MOCVD), molecular beam epitaxy (MBE), or hydride vapor phase epitaxy (HVPE), in the same manner as the N type semiconductor layer 240.

The P type semiconductor layer 260 may be formed by growing a semiconductor material such as GaN, AlGaN, InGaN, and AlInGaN on the active layer 250 through a deposition process such as metal organic chemical vapor deposition (MOCVD), molecular beam epitaxy (MBE), or hydride vapor phase epitaxy (HVPE).

Although the buffer layer 220 and the undoped semiconductor layer 230 are included between the substrate 210 and the N type semiconductor layer 240 in the aforementioned embodiment, any one of the buffer layer 220 and the undoped semiconductor layer 230 may be included between the substrate 210 and the N type semiconductor layer 240 or both of them may not be included between the substrate 20 and the N type semiconductor layer 240 in the modified embodiment.

Figure 9B:
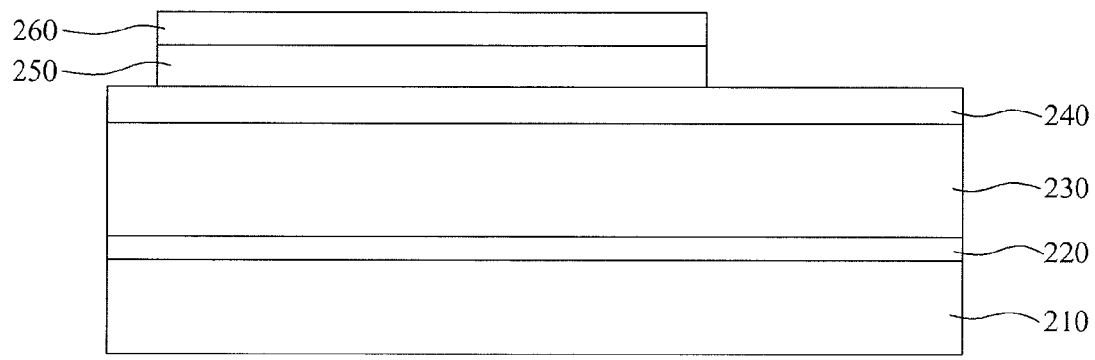
Figure 9C:
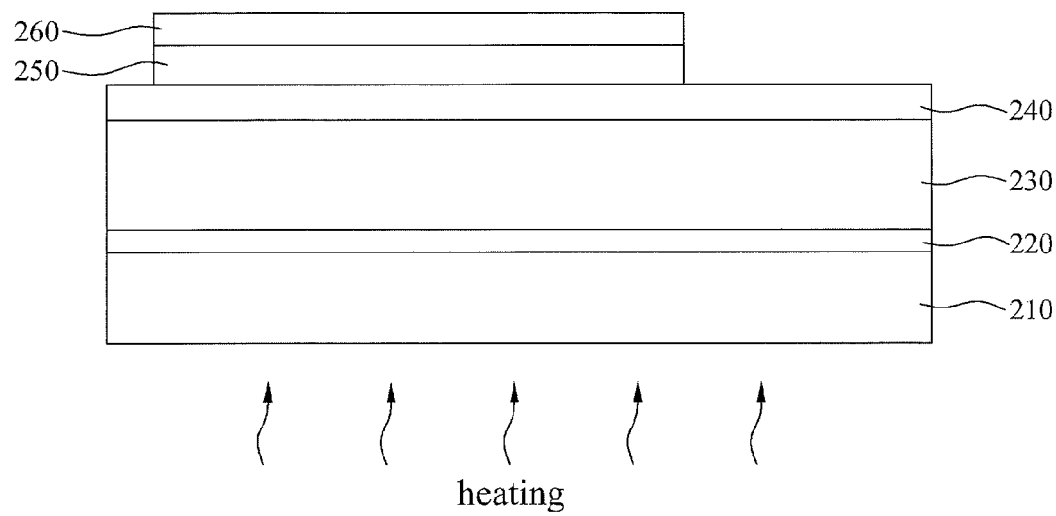

Next, as shown in FIG. 9b, mesa etching is carried out for to form the N type electrode 290, and a heating process is carrier out to reduce a defect generated by the mesa etching process as shown in FIG. 9c.

Figure 9D:
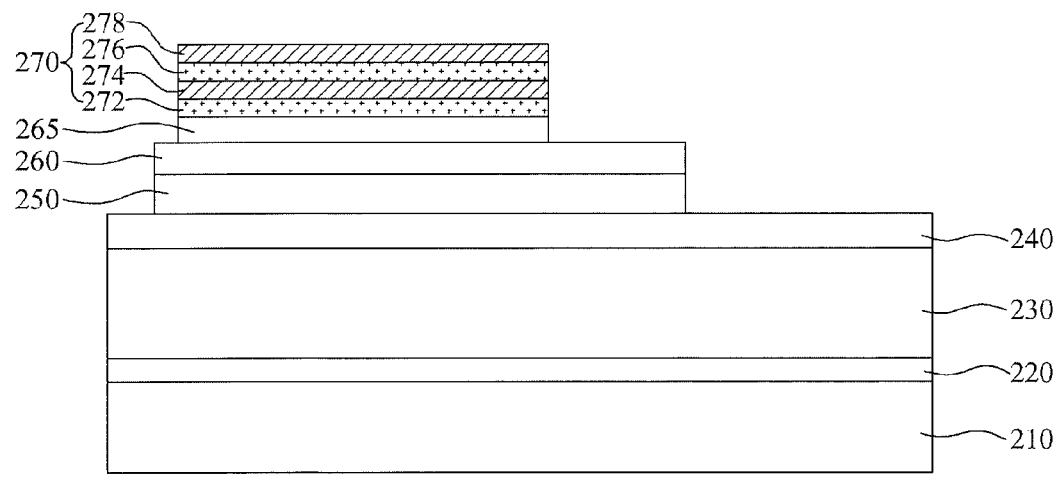

Next, as shown in FIG. 9d, the light transmissive electrode layer 270,in which the first conductive thin film 272, the first insulating thin film 274, the second conductive thin film 276, and the second insulating thin film 278 are sequentially deposited, is formed on the P type semiconductor layer 260. At this time, the aforementioned buffer layer 265 may additionally be formed between the first conductive thin film 272 and the P type semiconductor layer 260. The buffer layer 265 may protect the light transmissive electrode layer 270 from thermal attack that may occur during a later process.

In one embodiment, the first conductive thin film 272 may be formed at a thickness of 5 nm to 35 nm using Ag, the first insulating thin film 274 may be formed at a thickness of 10 nm to 70 nm using ZnS, the second conductive thin film 276 may be formed at a thickness of 1 nm to 35 nm using Ag, and the second insulating thin film 278 may be formed at a thickness of 10 nm to 70 nm using ZnS.

As described above, in the present invention unlike the general semiconductor light emitting device, since a transparent electrode layer formed of ITO is replaced with the light transmissive electrode layer 270 formed of at least one conductive thin film 272, 276 and at least one insulating thin film 274, 278, the manufacturing cost may be reduced and light efficiency may be improved.

Also, if a heating process is carried out after the first and second conductive thin films 272 and 276 constituting the light transmissive electrode layer 270 are formed, surface resistance may be increased and transmittance may be reduced due to change of characteristics of the first and second conductive thin films 272 and 276. Accordingly, in the aforementioned embodiment, the heating process is carrier out before the light transmissive electrode layer 270 is formed.

As described above, in the present invention, since the light transmissive electrode layer 270 is formed using at least one conductive thin film 272, 276 and at least one insulating thin film 274, 278 instead of ITO, and the heating process is carried out before the at least one conductive thin film 272, 276 and the at least one insulating thin film 274, 278 are formed, surface resistance is reduced to a level of 1/10 of that of the conventional transparent electrode layer of ITO.

The aforementioned embodiment has been described that the light transmissive electrode layer 270 is formed in a structure in which the first conductive thin film 272, the first insulating thin film 274, the second conductive thin film 276 and the second insulating thin film 278 are sequentially deposited.

However, in the modified embodiment, the light transmissive electrode layer 270 may include the first conductive thin film 272 and the first insulating thin film 274, or may include the first conductive thin film 272, the first insulating thin film 274, and the second conductive thin film 276.

In another embodiment, the light transmissive electrode layer 270 may be formed in a structure in which the first insulating thin film 274, the first conductive thin film 272, the second insulating thin film 278, and the second conductive thin film 276 are deposited sequentially. Also, the light transmissive electrode layer 270 may include the first insulating thin film 274 and the first conductive thin film 272, or may include the first insulating thin film 274, the first conductive thin film 272, and the second insulating thin film 278.

In still another embodiment, the light transmissive electrode layer 270 may be formed in a structure in which three or more conductive thin films and three or more insulating thin films are alternately deposited sequentially.

Figure 9E:
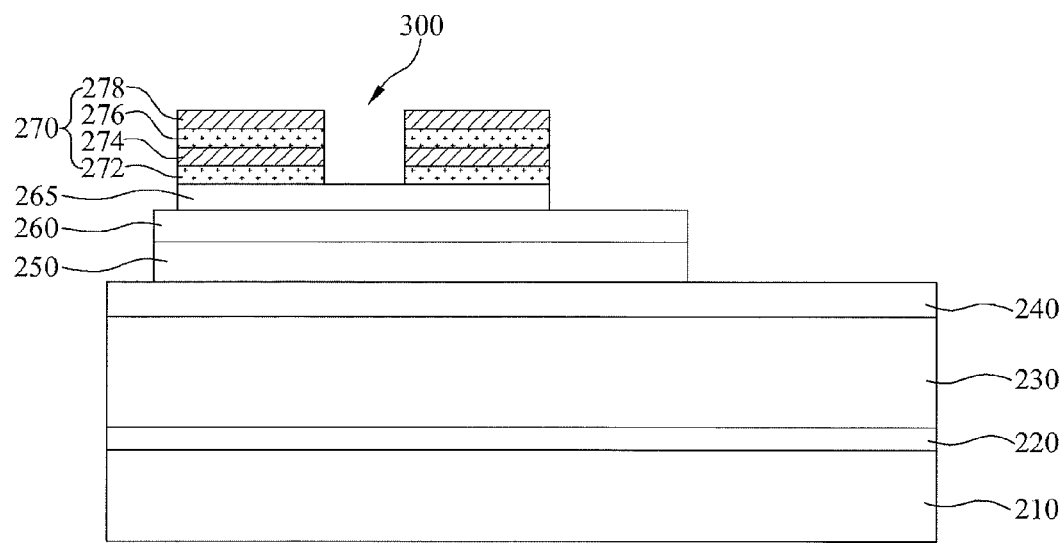

Referring to FIG. 9e, the first conductive thin film 272, the first insulating thin film 274, the second conductive thin film 276, and the second insulating thin film 278 are partially etched until the P type semiconductor layer 260 is exposed, whereby at least one contact portion 300 is formed.

Figure 9F:
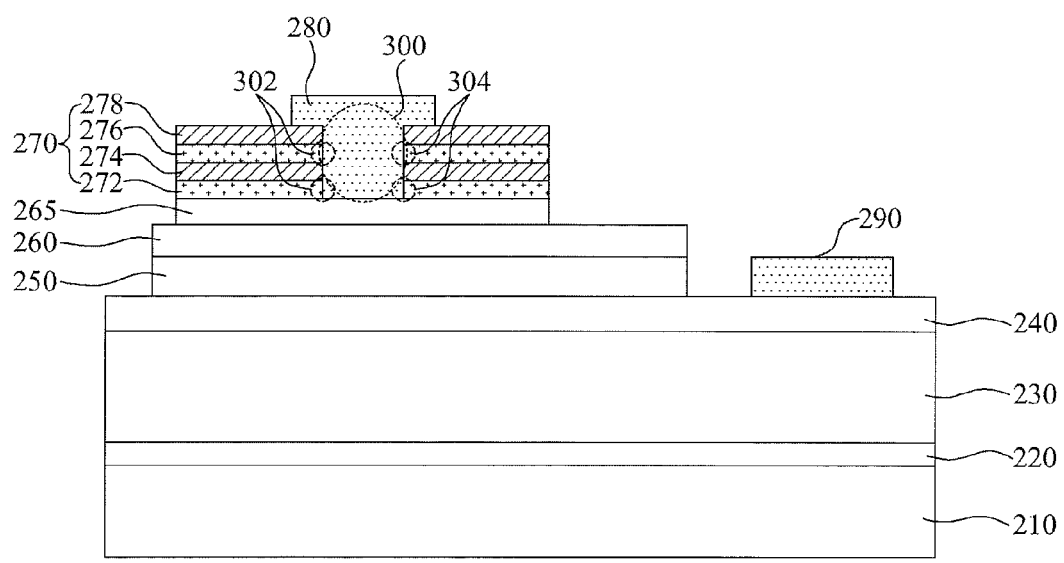

Afterwards, as shown in FIG. 9f, the P type electrode 280 (that includes P type pad and P type finger electrode) is formed to cover at least one contact portion 300 formed in the light transmissive electrode layer 270, and the N type electrode 290 (that includes N type pad and N type finger electrode) is formed on the semiconductor layer 240.

In other words, the P type electrode 280 is formed on the region that includes the contact portion 300 on the light transmissive electrode layer 270 as well as the inside of the contact portion 300. As a result, the P type electrode 280 is in contact with the sidewalls 302 and 304 of the first and second conductive thin films 272 and 276 through at least one contact portion 300, whereby current crowding may be prevented from occurring.

Meanwhile, although not shown in FIG. 9, the substrate may be thinned through a lapping or polishing process, and the semiconductor light emitting device may be separated by scribing process using a laser or diamond.

Next, a method for manufacturing a semiconductor light emitting device according to the second embodiment of the present invention will be described with reference to FIG. 10.

FIGS. 10a to 10f are cross-sectional views illustrating a method for manufacturing a semiconductor light emitting device according to the second embodiment of the present invention.

Since FIGS. 10a to 10d are the same as FIGS. 9a to 9d, their detailed description will be omitted.

Figure 10A:
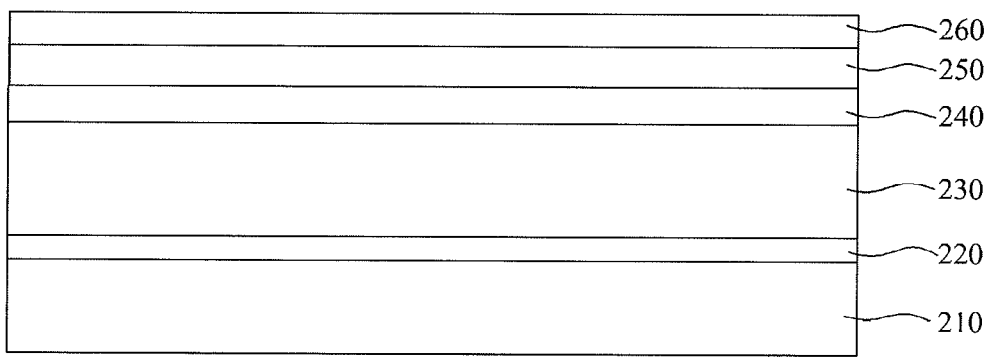
FIGS. 10a to 10f are cross-sectional views illustrating a method for manufacturing a semiconductor light emitting device according to the second embodiment of the present invention.
Figure 10B:
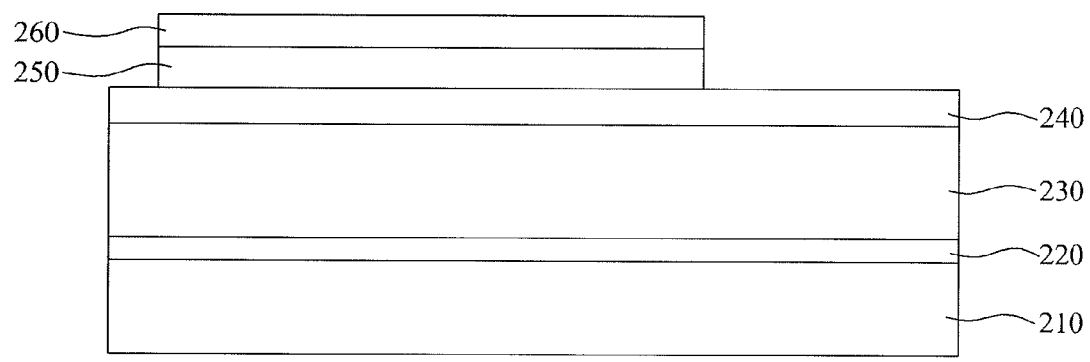
Figure 10C:
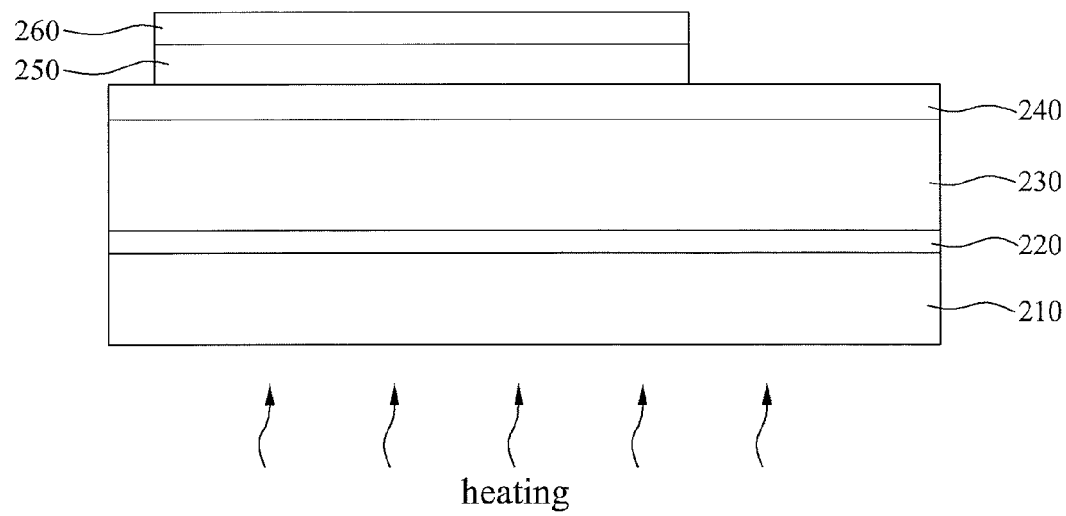
Figure 10D:
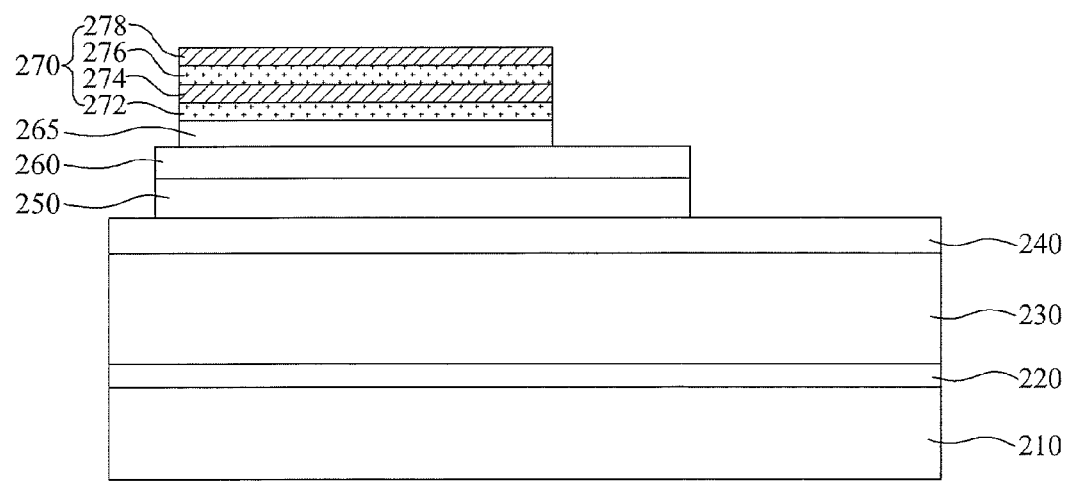
Figure 10E:
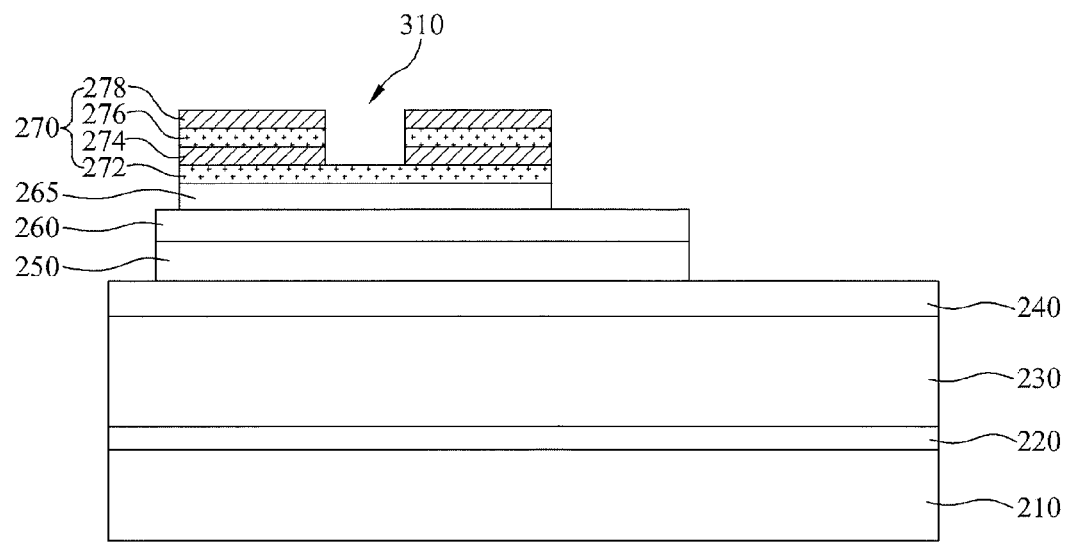

Referring to FIG. 10e, the first insulating thin film 274, the second conductive thin film 276, and the second insulating thin film 278 are partially etched until the first conductive thin film 272 is exposed, whereby at least one contact portion 310 is formed.

Figure 10F:
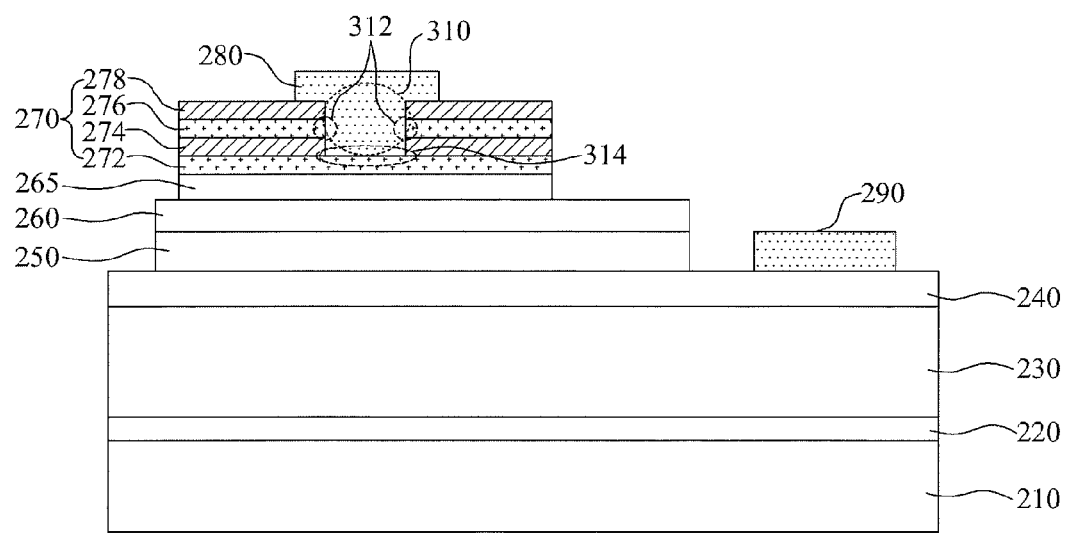

Afterwards, as shown in FIG. 10f, the P type electrode 280 is formed on the light transmissive electrode layer 270 to cover at least one contact portion 300 formed in the light transmissive electrode layer 270, and the N type electrode 290 is formed on the semiconductor layer 240.

In other words, the P type electrode 280 may be formed on the region that covers the contact portion 310 on the light transmissive electrode layer 270 as well as the inside of the at least one contact portion 310. As a result, the P type electrode 280 is in contact with the surface 314 of the first conductive thin film 272 as well as the sidewall 302 of the second conductive thin film 276 through at least one contact portion 310, whereby current crowding may be prevented from occurring.

Meanwhile, as shown in FIG. 10d, in the same manner as the method for manufacturing a semiconductor light emitting device according to the first embodiment, in the method for manufacturing a semiconductor light emitting device according to the second embodiment of the present invention, a buffer layer 265 may additionally be formed between the first conductive thin film 272 and the P type semiconductor layer 260 to improve contact resistance between the first conductive thin film 272 and the P type semiconductor layer 260, adhesion with a lower layer, and uniform growth of the conductive material, or protection of the light transmissive electrode layer 270 from thermal attack that may occur during a later process.

Also, in the method for manufacturing a semiconductor light emitting device according to the second embodiment of the present invention, the substrate may be thinned through a lapping or polishing process, the semiconductor light emitting device may be separated by scribing process using a laser or diamond.

As described above, the semiconductor light emitting device and the method for manufacturing the same according to the present invention have the following advantages.

According to the present invention, since the transparent electrode layer formed of ITO is replaced with the light transmissive electrode layer formed of the conductive thin film and the insulating thin film, the manufacturing cost of the semiconductor light emitting device can be reduced.

Also, according to the present invention, contact resistance, a driving voltage, and current crowding can be reduced by increasing the contact surface between the conductive thin film and the electrode, whereby light efficiency can be improved.

Also, according to the present invention, since the heating process is omitted or carried out before the conductive thin film constituting the light transmissive electrode layer is formed, characteristic variation of the conductive thin film can be minimized.

It will be apparent to those skilled in the art that various modifications and variations can be made in the present invention without departing from the spirit or scope of the inventions.

For example, in the aforementioned embodiments, although the heating process is required to manufacture the semiconductor light emitting device, since the heating process is intended to reduce a defect caused by mesa etching, it may be omitted.

Thus, it is to be understood that the aforementioned embodiments are only exemplary and not restrictive. It is intended that the present invention covers the modifications and variations of this invention provided they come within the scope of the appended claims and their equivalents.

What is claimed is:

1. A method for manufacturing a semiconductor light emitting device, the method comprising the steps of:
   forming a first semiconductor layer on a substrate;
   forming an active layer on the first semiconductor layer;
   forming a second semiconductor layer on the active layer;
   partially etching the active layer and the second semiconductor layer until the first semiconductor layer is exposed;
   heating the substrate on which the first semiconductor layer, the active layer and the second semiconductor layer are formed;
   forming a light transmissive electrode layer on the second semiconductor layer, the light transmissive electrode layer including at least one conductive thin film and at least one insulating thin film,
   wherein the step of forming the light transmissive electrode layer includes:
      forming a first conductive thin film on the second semiconductor layer;

forming a first insulating thin film on the first conductive thin film;

forming a second conductive thin film on the first insulating thin film;

forming a second insulating thin film on the second conductive thin film; and forming one or more contact portions by partially etching the first insulating thin film, the second conductive thin film and the second insulating thin film until the first conductive thin film is exposed without etching the first conductive thin film; and forming a first electrode being in contact with the first and second conductive thin films through the one or more contact portions and forming a second electrode on the first semiconductor layer on which the active layer and the second semiconductor layer are not formed, wherein the first and second conductive thin films and the first and second insulating thin films are formed with the same pattern, wherein the step of heating the substrate is performed between the step of partially etching the active layer and the second semiconductor layer and the step of forming the light transmissive electrode layer.

2. The method of claim 1, wherein the step of forming the light transmissive electrode layer includes forming a buffer layer between the second semiconductor layer and the light transmissive electrode layer.

3. The method of claim 1, wherein the at least one conductive thin film is formed of Ag, and the at least one insulating thin film is formed of ZnS.

* * * * *